United States Patent [19]

Hamilton et al.

[11] Patent Number: 5,450,455
[45] Date of Patent: Sep. 12, 1995

[54] METHOD AND APPARATUS FOR INCLUDING THE STATES OF NONSCANNABLE PARTS IN A SCAN CHAIN

[75] Inventors: Stephen W. Hamilton, Los Gatos; Walter E. Gibson, San Jose; Cheng-Gang Kong, Saratoga, all of Calif.

[73] Assignee: Tandem Computers Incorporated, Cupertino, Calif.

[21] Appl. No.: 84,039

[22] Filed: Jun. 28, 1993

[51] Int. Cl.6 .................................................. H04B 3/46
[52] U.S. Cl. ...................... 375/213; 375/224; 365/201; 371/22.3
[58] Field of Search ............... 375/10, 224, 225, 228, 375/213; 365/201; 371/22.0, 22.1, 22.3, 22.5, 22.6; 358/474

[56] References Cited

U.S. PATENT DOCUMENTS

| | | | |
|---|---|---|---|
| 4,481,627 | 11/1984 | Beauchesne et al. | 371/22.6 |
| 4,827,476 | 5/1989 | Garcia | 371/22.3 |
| 5,006,787 | 4/1991 | Katircioglu | 324/73.1 |
| 5,155,432 | 10/1992 | Mahoney | 371/22.3 |
| 5,157,781 | 10/1992 | Harwood et al. | 395/575 |
| 5,172,377 | 12/1992 | Robinson et al. | 371/22.3 |
| 5,173,904 | 12/1992 | Daniels et al. | 371/22.3 |
| 5,301,156 | 4/1994 | Talley | 365/201 |
| 5,325,367 | 6/1994 | Dekker et al. | 371/22.3 |

*Primary Examiner*—Edward L. Coles, Sr.
*Assistant Examiner*—Madeleine Au Nguyen
*Attorney, Agent, or Firm*—Townsend and Townsend and Crew

[57] ABSTRACT

A scannable logic unit includes one or more storage registers that maintain copies of data communicated from the scannable unit to registers in a nonscannable unit. When the scannable unit is subjected to a scan test, the registers will contain state information respecting that transfer to the nonscannable unit. When the scannable and nonscannable units are placed in a run condition, the registers supply to the nonscannable unit state information for continuing operation.

6 Claims, 2 Drawing Sheets

METHOD AND APPARATUS FOR INCLUDING THE STATES OF NONSCANNABLE PARTS IN A SCAN CHAIN

BACKGROUND OF THE INVENTION

The present invention is directed generally to digital apparatus, and more particularly, to apparatus that incorporates in the scan chain of a scannable circuit the state information conveyed to a nonscannable unit.

Today's state of the art in digital design often will require the incorporation of features that will allow the design to be tested—both during production and when in the field in the hands of the end user. One of the more popular test techniques used in digital designs for test implementation is what is termed a "scan based design." This involves adding logic to the design of conventional digital circuitry so that, in response to test signals, the elemental storage units (e.g., latches, register stages, flip flops, and the like) of the digital circuitry can be configured into one or more extended shift registers ("scan chains"). Test patterns ("vectors") may then be introduced ("scanned") into the scan chains so formed, and the digital circuitry returned to its standard configuration and allowed to run normally for one or more of its operating cycles. The scan chains are then reformed so that the resultant registered state of the digital system can be removed and examined.

Alternatively, the digital circuit under test can be allowed to run normally until it reaches a point in time when the scan test halts normal operation of the circuit. The scan chain configurations are then formed, and the registered state of the circuitry is removed, observed, reinstated, and the unit allowed to proceed after being returned to its standard configuration.

Scan designs provide an effective and efficient method of establishing controllability and observability over the "registered state" of the digital circuitry (i.e., the states assumed by the elemental memory units at any moment in time) in that operation of the unit or circuit under test can be stopped at any point in time, the unit reconfigured to its scan configuration, and that state retrieved, observed, and replaced. The circuit under test may then be returned to the normal operating mode and continue until it is again stopped and its registered state observed as described.

Often, designs of digital units in the current art will combine such scannable components with standard, off-the-shelf components (e.g., microprocessors, random access memories (RAMs), and the like) that are not designed to be scannable. Thus, the registered state of these standard components are, therefore, outside the controllable and observable domains of a scan test procedure. This combination of scannable components with nonscannnable components can significantly limit the testability of the overall combination.

Since such nonscannable parts cannot be included in any scan string, any initial registered state values they may hold after a scan test (Or an initialization) of a scannable part must be considered indeterminate. This indeterminate state will tend to propagate indeterminism elsewhere, forcing use of one of several remedies: (1) add extra logic to block the formation and propagation of such indeterminate state (and accept large untestable areas of circuitry); (2) add complicated test sequences following the scan to functionally eliminate the indeterminate state; or, (3) some combination of the foregoing.

It can be seen, therefore, that a need exists for the registered state of non-scannable circuitry to co-exist with scannable circuitry for testing purposes.

SUMMARY OF THE INVENTION

The present invention recognizes that certain of the registered state of a nonscannable component originates with, and will be transferred from the scannable unit. According to the present invention, therefore, the registered state transferred by the scannable component is replicated and stored in scannable registers contained in the scannable circuitry. Thus, scan testing the scannable component will also permit observation of the defect-free registered state of the nonscannable element.

DESCRIPTION OF THE PREFERRED EMBODIMENT

Figure 1:
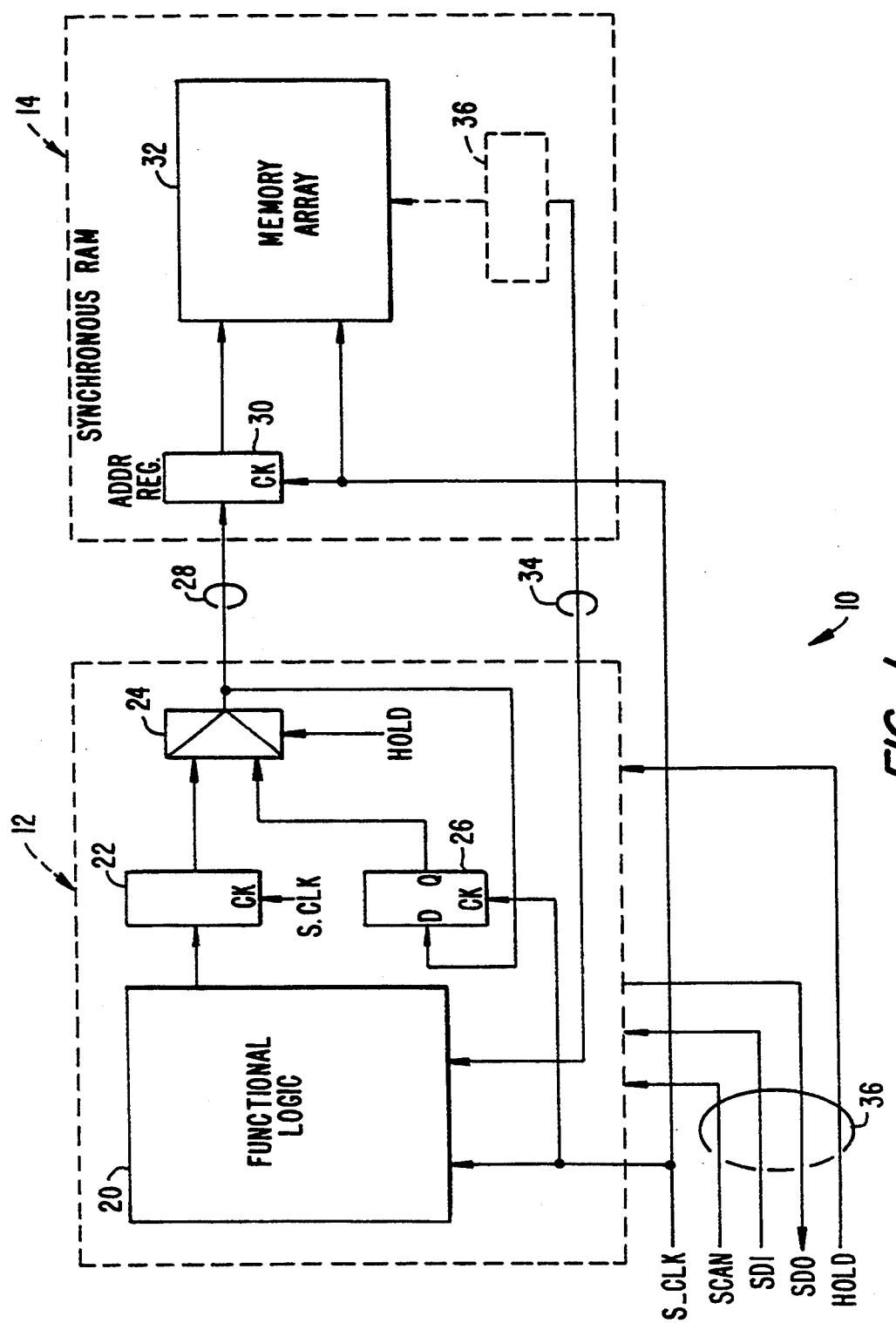
FIG. 1 is a diagrammatic illustration of a scannable component, incorporating the invention, coupled to a nonscannable component.

Referring now to the figures, and for the moment specifically FIG. 1, there is illustrated a portion of a digital system, designated with the reference numeral 10, that includes two system components 12 and 14. The component 12, which may be an application specific integrated circuit (ASIC), and the component 14 is a synchronous random access memory (RAM). As FIG. 1 shows, the component 12 includes functional logic 20 which symbolically represents most of the digital circuitry of the component 12, coupled to an output register 22. The content of the output register, via a multiplexer 24, supplies multi-bit addresses to an address bus 28 which communicates the addresses to an address register 30 of the synchronous RAM 14. Data is accessed from a memory array 32 of the synchronous RAM 14 in response to the addresses received by the address register 30, and communicated to the component 12 by the data bus 34.

The output of the multiplexer 24 is also coupled to a shadow register 26 to receive the addresses communicated to the address register 30.

The component 12 is designed to be scannable in the sense discussed above, i.e., its elemental memory units (e.g., flip flops, registers, latches, and the like), including those that may make up the functional logic 20 and output and shadow registers 22, 26, are configurable to operate in one of the three modes of "run" (the element operates normally, and the SCAN and HOLD signals are de-asserted), "hold" (the element holds its state), and "scan" (all the elements configured to form one or more scan chains). For this purpose the component 12 is coupled to a test bus 36 for receiving test signals SCAN and HOLD from a test control device (not shown). In addition, the test bus 36 includes a scan data in (SDI) line for serially communicating test vectors (data strings) or to replace the previously removed registered state of the component 12. Of course the component must be placed in the scan mode by assertion of the SCAN test signal to receive data on the SDI line.

The registered state of the component 12 is serially removed, again when in scan mode, via the scan data out (SDO) output line.

When operating normally (i.e., during run mode), the HOLD test signal is not asserted. And, it is the non-asserted state of HOLD that operates the multiplexer 24 to select and pass the content of the output register 22 to the address bus 28, and to the shadow and address registers 26, 30 (all under the synchronous control of the system clock, S_CLK). During run mode, from time to time, addresses will be communicated to the synchronous RAM 14 for addressing memory locations of the memory array 32 from which data is to be accessed, or at which data will be written. The addresses are received and temporarily held in address register 30 of the synchronous RAM 14 to address the memory array 32. Thus, the synchronous RAM 14 is an example of a commercial element having non-scannable registered elements (unless designed to be scannable—which in the context of this discussion it is not).

Figure 2:
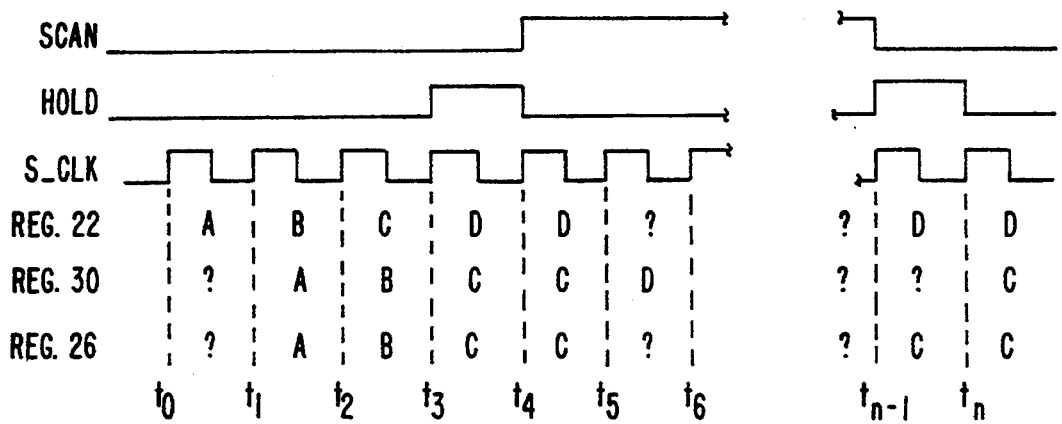
FIG. 2 is a timing diagram illustrating operation of the invention.
Figure 3:
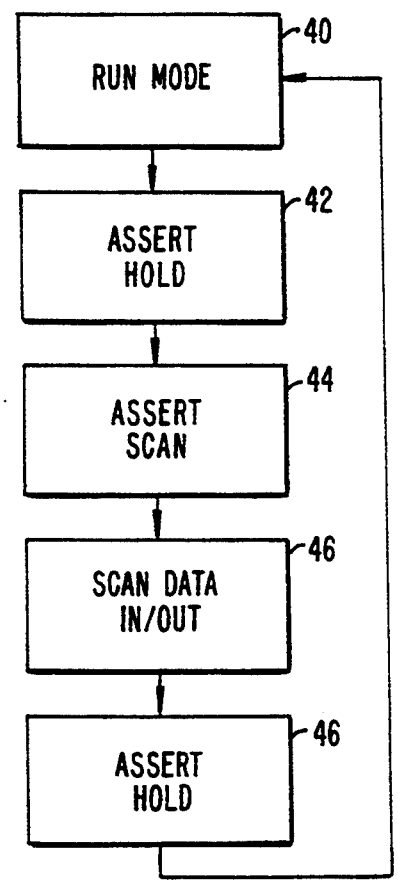
FIG. 3 is a flow chart illustrating use of the invention to switch between run modes of operation and scan modes of operation.

Referring now to FIGS. 2 and 3, operation of the present invention to include the registered state (i.e., the content of register 30) in the scan chain will now be described. At some point in time during run mode (e.g., step 40 of FIG. 3) it is decided to enter scan mode for the purpose of removing for examination the registered state of the system 10. How the decision is made is not important to the present invention; it could be made programmatically (as by the test unit (not shown) that supplies the test signals) or by a user who may manually commands the test unit to replace the registered state of the system 10.

Before continuing, consider for the moment FIG. 2 which illustrates the contents of the registers 22, 26, and 30. Prior to leaving the run mode (step 40, FIG. 3), at time $t_0$, the output register receives address A. At the next cycle of the system clock, S_CLK, time $t_1$, the output register receives address B, and the prior content of the output register 22 (address A) is transferred to the address register 30 and the shadow register 26. The next cycle (time $t_2$) finds address B in the shadow and address registers 26, 30, while the output register 22 has received address C.

Now, prior to time $t_3$, the decision is made to remove the registered state of the system 10 (i.e., component 12) so that, at time $t_3$, the run mode of step 40 (FIG. 3) is departed in favor of step 42 in which the HOLD test signal is asserted. The HOLD signal will, as explained above, freeze the registered state of the component 12 while asserted. However, since the synchronous RAM 14 is non-scannable, the HOLD signal will have no effect on it or its registered state (i.e., address register 30). The SCAN signal would then be asserted to reconfigure the scannable registers into one or more scan chains, and the state of the component 12 serially removed, using S_CLK, via the scan data out (SDO) signal line where it can be observed.

Assertion of the SCAN signal will operate to block the write enable to the synchronous RAM 14 to ensure that no spurious write operations are performed during the scan of the component 12.

The S_CLK signal, which is also applied to the synchronous RAM 14, and during extraction of the state of the component, the address register 30 of the synchronous RAM will continually be clocked by S_CLK to receive whatever content the output register 22 (which, of course, is part of the scan chain) contains at the time. Thus, at the completion of the scan it is not known what the content of the address register 30 will be, i.e., its content is indeterminant. When, after observation, the removed state is returned to the component 12 (via the scan data in SDI signal line), and the component returned to its normal, operating state, the content of the indeterminate content of the address register 30 can be propagated by the data that may be written to, or accessed from the memory array 32 when operation is resumed. It is this propagation of indeterminate state to which the invention directed.

The problem of propagation of indeterminate states as a result of scanning the component 12 is obviated by addition of the multiplexer 24 and the shadow register 26. As will also be seen, use of the multiplexer 24 and shadow register 26 provides an effective technique for including the fault-free registered state (i.e., address register 30) of what is essentially a non-scannable part in the scan string of the component 12.

During normal operation the HOLD signal that is applied to the control input of the multiplexer 24 is not asserted so that the content of the output register 22 is selected and passed by the multiplexer 24 to the address register 30. However, each time the state (i.e., address) of the output register 22 is so transferred, it is also communicated to and stored in the shadow register 26.

At time $t_3$, the test control unit responds to programmatic or user input to assert the HOLD test signal and the run mode step 40 is left via step 42 in favor of step 44 (FIG. 3). At time $t_4$, with the HOLD signal asserted, the output register 22 and shadow register 26 will disregard S_CLK and retain their content (i.e., addresses D and C, respectively). However, address register 30 is not affected by the HOLD signal, and will therefore receive the address C applied to it by register 26 (via the MUX 24). The SCAN signal is asserted in step 44 (FIG. 3) at time $t_4$, and the HOLD signal deasserted. Then, during step 46 (which will last many S_CLK cycles), the state of the component 12 is removed and replaced, during which time the address register 30 becomes indeterminate. As noted above, the SCAN signal will operate to block write enable to the synchronous RAM 14. Thus, while SCAN is asserted, the synchronous RAM 14 is prevented from performing write operations, and the various indeterminate states assumed by the component 12 during scan testing will not affect the content of the memory array 32 of the synchronous RAM 14.

After the appropriate number (n−1) of S_CLK pulses, the scan is completed, and the state of the component 12 restored. That restoration will place the component 12 in the state it had entered before leaving the run mode n favor of being scanned, i.e, the state it held just before time $t_3$. Before the system 10 is returned to the run mode (step 40—FIG. 3), however the indeterminate state of the address register 30 must be replaced; if not, this indeterminacy will be propagated through the system (e.g., back into the component 12) by data that will be read from (or written to) a memory location of the memory array 32 that will have no meaning in the ongoing scheme of operation.

In order to restore the address register 30 to a proper state, the HOLD is asserted for one or more clock periods of S_CLK. During the clock period beginning at time $t_{n-1}$, the address scanned into the shadow register will be selected by the multiplexer 24 and placed on the address bus 28 by the HOLD signal, and loaded in the address register 30. At time $t_n$ the system 10 is returned to the run mode (step 40—FIG. 3), by de-asserting the SCAN and HOLD signals, where operation resumes from the point just before steps 42, 44 were entered, and with the address register 30 containing the proper address C. Note that when operation is resumed, the content of the address register 30 is no longer unknown, i.e, indeterminate but, rather, contains the quantity that it should, address C. Note also that the information state that would have been contained in the address register 30 when scan test was initiated was, in fact, included in the scan test by it being stored in the shadow register 26.

Thus, it should now be apparent to those skilled in this art that the invention allows a scan of a scannable device to be followed by normal operation without elaborate procedures to remove any indeterminate states. In addition, the invention is capable of including the defect-free state of a nonscannable part (i.e., address register 30 of the synchronous RAM 14) in the scan.

The invention has been described in the context of a limited "pipeline" architecture that includes the output register 26 and address register 30, permitting at least some parallel processing with communication of addresses to the synchronous RAM 14. The pipeline shown here has only the address register 30 as its non-scannable part. However, the non-scannable element e.g., synchronous RAM 14 could add more to the pipeline such as, for example, having a data register (shown in phantom in FIG. 1 as the data register 36) for communicating data between the memory array 32 of the synchronous RAM 14 and the component 12. Since during a scan of the component 12 it will be unknown what will be the content the data register 36, another indeterminacy is added. Those skilled in this art will recognize, therefore, that the concepts of this invention can be extended to cover pipeline architecture having more of that pipeline in the nonscannable registers.

What is claimed is:

1. Apparatus for including state information of a nonscannable digital device in a scan of a scannable device, the state information being transferred from an output of the scannable device to the nonscannable digital device, the apparatus comprising;
    scannable register means, forming a part of the scannable device and coupled in parallel with the output of the scannable device, for receiving the state information communicated from the output to the nonscannable device, the scannable register means being configured to be included in the scan of the scannable device; and
    means for momentarily communicating the register means to the nonscannable device at the conclusion of the scan of the scannable device.

2. In a digital system including a scannable logic unit having a plurality of elemental storage units configurable from an operating mode to respond to a first test signal to form at least one extended shift register, predetermined ones of the plurality of elemental storage units forming a first register means when the scannable logic unit is in said operating mode, and a non-scannable logic unit having a second register means coupled to receive data from the first register means, the scannable logic unit having apparatus comprising:
    third register means formed from other ones of the plurality of the elemental storage units when the scannable logic unit is in said operating mode, the third register means being coupled receive, in parallel the data coupled to the second register means; and
    selection means coupled to the first and the third register means for selectively communicating data from the first register means or the third register means to the second register means in response to a second test signal.

3. The apparatus of claim 2, wherein the selection means is a multiplexer.

4. Apparatus for including state information of a nonscannable digital device in a scan of a scannable device, the scannable device selectively operating in a run mode, during which the state information is transferred from an output of the scannable device to the nonscannable digital device, and a test mode during which data is scanned from the scannable device, the apparatus comprising;
    a scannable register element coupled in parallel with the output of the scannable device to receive and temporarily store the state information communicated from the output of the scannable device to the nonscannable digital device, the scannable register element operating to include the state information with the data during the test mode; and
    a circuit that momentarily communicates the scannable register element to the nonscannable device at the conclusion of the test mode.

5. A digital system including a scannable logic unit having a plurality of elemental storage units, a first number of the elemental storage units forming a first data register when the scannable logic unit is in an operating mode, the plurality of elemental storage units forming at least one extended shift register in response to test signals that place the scannable logic unit in a test mode, and a non-scannable logic unit having a second data register coupled to receive data from the first data register, the scannable logic unit having apparatus including:
    a third data register formed from a second number of the plurality of the elemental storage units when the scannable logic unit is in said operating mode, the third data register being coupled receive, in parallel, the data coupled to the second data register from the first data register; and
    a selection circuit coupled to selectively communicate data from the first data register to the second data register when the scannable logic unit is in the operating mode, and to communicate data from the third data register to the second data register in response to a one of the test signals.

6. A method of including state information of a non-scannable logic unit in a scan of a scannable logic unit having a plurality of elemental storage units, a first number of the elemental storage units forming a first data register when the scannable logic unit is in an operating mode, the plurality of elemental storage units, including the first number of the elemental storage units, forming at least one extended shift register in response to test signals that place the scannable logic unit in a test mode, and a non-scannable logic unit having a second data register coupled to receive data from the first data register, the method including the steps of:
    forming, from a second number of the plurality of the elemental storage units, a third data register when the scannable logic unit is in said operating mode, the third data register being coupled receive, in parallel, the data coupled to the second data register from the first data register; and
    selectively communicating data from the first data register to the second data register when the scannable logic unit is in the operating mode, and from the third data register to the second data register at the conclusion of the test mode.

* * * * *